(12) United States Patent
Beer et al.

(10) Patent No.: US 7,585,701 B2
(45) Date of Patent: Sep. 8, 2009

(54) CARRIER SHEET WITH ADHESIVE FILM AND METHOD FOR PRODUCING SEMICONDUCTOR DEVICES USING THE CARRIER SHEET WITH ADHESIVE FILM

(75) Inventors: Gottfried Beer, Nittendorf (DE); Markus Brunnbauer, Lappersdorf (DE); Irmgard Escher-Poeppel, Regensburg (DE); Edward Fuergut, Dasing (DE)

(73) Assignee: Infineon Technologies AG, Neubiberg (DE)

( * ) Notice: Subject to any disclaimer, the term of this patent is extended or adjusted under 35 U.S.C. 154(b) by 510 days.

(21) Appl. No.: 11/439,425

(22) Filed: May 24, 2006

(65) Prior Publication Data

US 2006/0273469 A1    Dec. 7, 2006

(30) Foreign Application Priority Data

May 24, 2005    (DE) .................. 10 2005 024 431

(51) Int. Cl.
*H01L 21/00* (2006.01)
(52) U.S. Cl. ..................................... 438/118
(58) Field of Classification Search ............ 438/118
See application file for complete search history.

(56) References Cited

U.S. PATENT DOCUMENTS

| 6,295,978 | B1 | 10/2001 | Wark et al. |
| 2004/0232543 | A1 | 11/2004 | Goller et al. |

FOREIGN PATENT DOCUMENTS

| DE | 103 36 375 A1 | 2/2004 |
| EP | 1 244 143 A2 | 3/2001 |
| EP | 1 484 791 A1 | 12/2004 |
| WO | WO 2005/013352 A2 | 2/2005 |
| WO | WO 2005/086224 A1 | 9/2005 |
| WO | WO2006126761 | * 11/2006 |

OTHER PUBLICATIONS

Takehiro, Ozawa "Adhesive Properties of Ultraviolet Curable Pressure-Sensitive Adhesive Tape for Semiconductor Processing (I)—Interpretation via Rheological Viewpoint" Furukawa Review Apr. 20, 2001 pp. 83-88.*

* cited by examiner

*Primary Examiner*—N Drew Richards
*Assistant Examiner*—Grant S Withers
(74) *Attorney, Agent, or Firm*—Edell, Shapiro & Finnan, LLC

(57) ABSTRACT

A carrier sheet with an adhesive film includes a heat-resistant base film with an upper side and an underside, and a thermoactive adhesive layer arranged on the underside of the base film and oriented toward the carrier sheet. The upper side of the base film includes an adhesive layer with semiconductor chips fixed on it, the semiconductor chips being surrounded by deactivated regions of the adhesive layer of the film upper side.

8 Claims, 3 Drawing Sheets

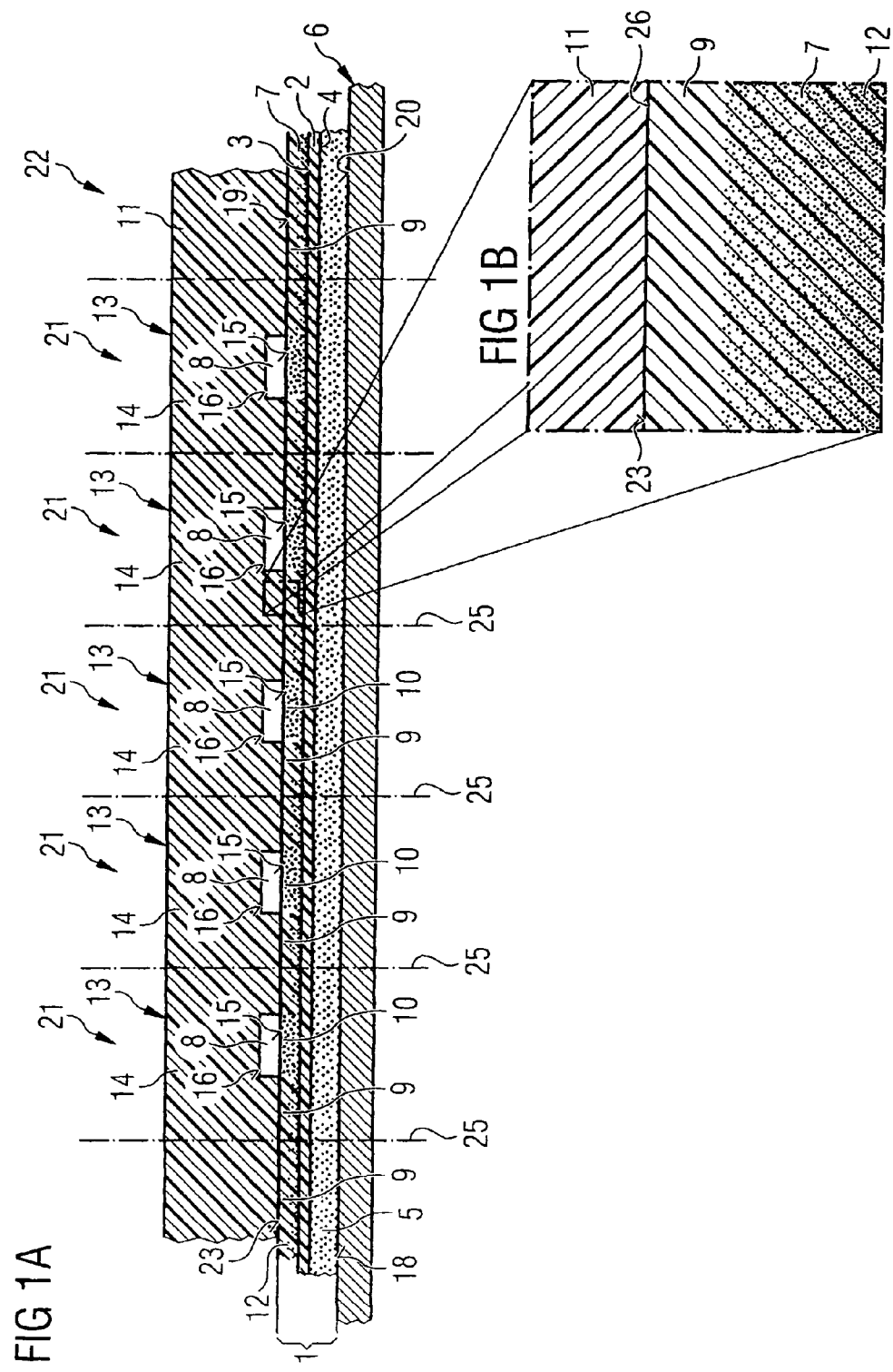

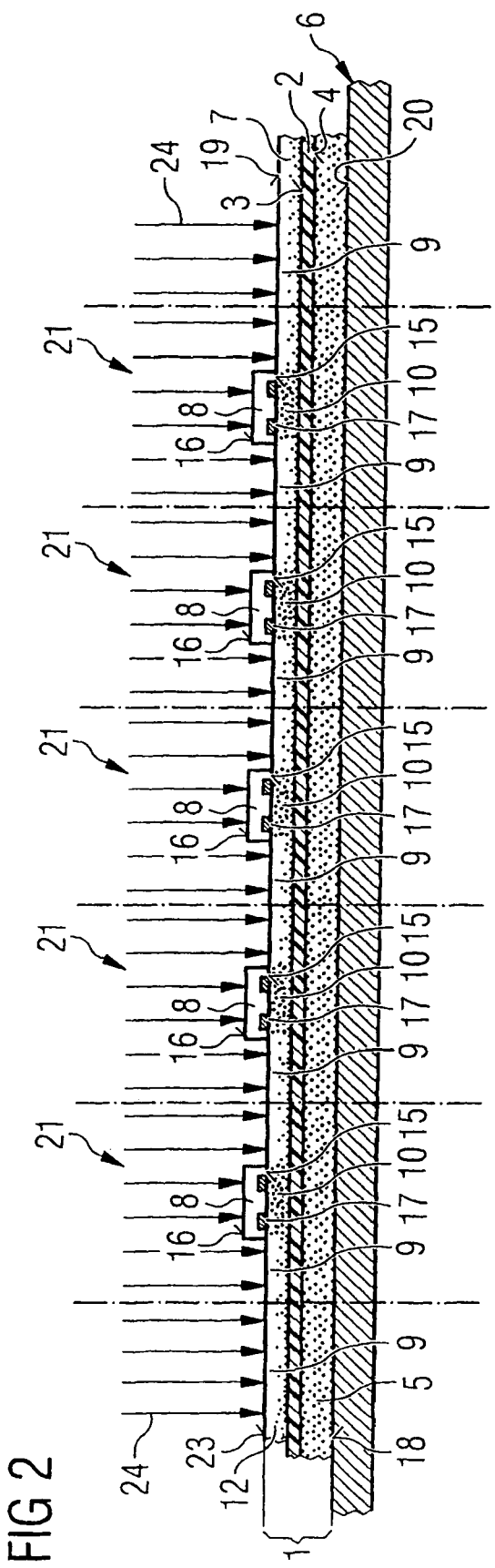

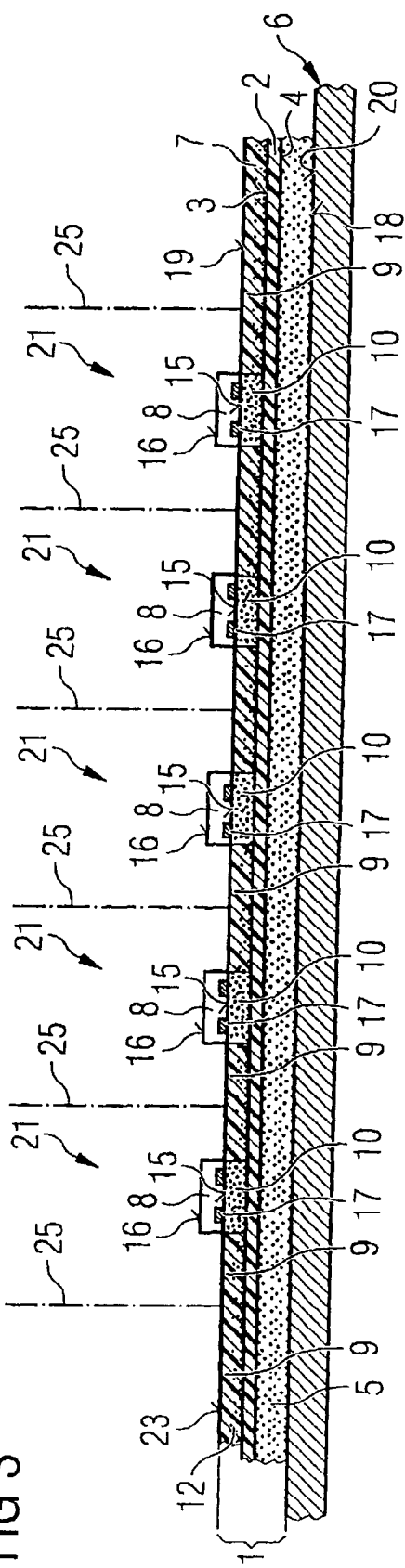

CARRIER SHEET WITH ADHESIVE FILM AND METHOD FOR PRODUCING SEMICONDUCTOR DEVICES USING THE CARRIER SHEET WITH ADHESIVE FILM

CROSS REFERENCE TO RELATED APPLICATIONS

This application claims priority under 35 USC §119 to German Application No. DE 10 2005 024 431.9, filed on May 24, 2005, and titled "Carrier Sheet with Adhesive Film and Method for Producing Semiconductor Devices Using the Carrier Sheet with Adhesive Film," the entire contents of which are hereby incorporated by reference.

FIELD OF THE INVENTION

The invention relates to a carrier sheet with adhesive film that includes a heat-resistant base film.

BACKGROUND

Double-sided adhesive films which can be positioned on corresponding carrier sheets are known in the art and are used variously in semiconductor technology. However, a particular problem arises if such adhesive films come into contact with plastic package molding compounds and form a common boundary surface. It is found in this case that the double-sided adhesive films have an undesirably strong adhesion in relation to the molding compound. This adhesion may be attributable to chemical or physical interaction between the adhesive of the double-sided adhesive film and the constituents of the uncured plastic package molding compound.

This leads, for example, to problems in the production of so-called panels, which have a multiplicity of semiconductor chips and are cast in a plastic package molding compound, such double-sided adhesive films being used for producing a coplanar upper side between the upper sides of the semiconductor chips and the plastic package molding compound of the panel. The adhesive layer of the film is intended, on the one hand, to fix the semiconductor chips at the semiconductor device positions and, on the other hand, in a later step, to release the coplanar upper side from active upper sides of the semiconductor chip and from the surface of the plastic package molding compound after curing of the plastic package molding compound and removal of the film together with the carrier sheet from the coplanar upper side.

The unwanted interactions between the double-sided adhesive film and the plastic package molding compound have adverse effects, so that the coplanar upper side does not have adequate planarity, in order to apply a wiring structure for semiconductor devices to it. The problem of the adhesion of a plastic package molding compound on double-sided adhesive films is so complex that no low-cost, usable solution is presently available.

SUMMARY OF THE INVENTION

The present invention provides a carrier sheet with adhesive film and a method for producing semiconductor devices in which the problem of adhesion between the plastic package molding compound and the adhesive film of a carrier sheet is resolved.

In accordance with the present invention, a carrier sheet with adhesive film is provided, the adhesive film comprising a heat-resistant base film with an upper side and an underside, the base film preferably comprising polyethylene terephthalate (PET) and an ethylene-modified polytetrafluoroethylene (ETFE). Arranged on the underside of the base film, toward the carrier sheet, is a layer of thermally active adhesive, while the upper side of the base film includes an adhesive layer with semiconductor chips fixed on it. The semiconductor chips are surrounded by deactivated regions of the adhesive layer of the upper side of the film.

One advantage of this carrier sheet with adhesive film is that the deactivated regions of the adhesive layer on the upper side no longer enter into interaction with a plastic package molding compound, so that the carrier sheet with the adhesive film can be removed from the forming coplanar upper side, comprising upper sides of the semiconductor chips and the surface of the plastic package molding compound, without leaving any residual material behind. At the same time, however, the adhesive effect of the adhesive layer with respect to the semiconductor chips is obtained, so that the latter retain their position on the carrier sheet when the plastic package molding compound is applied.

Another advantage of this carrier sheet with adhesive film is consequently that partial regions of the upper side of the adhesive film are deactivated and no longer exhibit any adhesive effect, while the regions which are intended to have the adhesive effect under the semiconductor chips continue as before to produce the full adhesive effect. Nevertheless, the adhesive effect of the film is not so great that, after they become embedded in the plastic package molding compound, the semiconductor chips can be torn out from the plastic package molding compound. Instead, the adhesive effect of the adhesive film is still sufficient to keep the semiconductor chips in position for embedding in a plastic package molding compound or for forming a panel, but it is not so great that, when the adhesive film is removed, the semiconductor chips can be torn out from the cooled-down plastic package molding compound.

The deactivated regions, on the other hand, exhibit reduced adhesion of the plastic package molding compounds that are used in semiconductor package technology, the type of application not being decisive; that is to say, the plastic package molding compound may be applied to the carrier sheet of the adhesive film by dispensing or by an injection-molding process.

In an exemplary embodiment of the invention, the deactivated regions include an artificially aged adhesive layer. Such artificial aging can be achieved in various ways. Preferably, the deactivated regions of the adhesive layer include a surface with a changed elementary composition. This can be achieved by the upper side of the carrier sheet with adhesive film and semiconductor chips adhesively attached on it being exposed to a plasma in which the elements to be introduced are contained, according to the intended modification. The adhesive and active regions under the semiconductor chips are protected, while the regions surrounding the semiconductor chips age or ash.

In a further exemplary embodiment of the invention, the deactivated regions of the adhesive layer have a higher degree of crosslinking of polymer chains than the actively adhesive regions under the semiconductor chips. This higher degree of crosslinking of the polymer chains may be achieved by high-energy irradiation of the adhesive layer and an associated premature artificial aging. The adhesive layer is thereby prematurely cured and its adhesive effect in relation to a plastic package molding compound is reduced accordingly.

In a further embodiment of the invention, the adhesive film has an acrylic-containing adhesive layer. These acrylic-containing adhesives have the advantage that they form a thermoreactive adhesive layer in relation to the carrier sheet and, by appropriate irradiation, they prematurely age and lose their adhesive effect on the upper side of the base film, accessible from above. The preferred irradiation for acrylic-containing adhesive layers is UV irradiation.

In another exemplary embodiment of the invention, the adhesive film includes on the upper side under the semiconductor chips an adhesive photoresist layer, and the deactivated regions include a cured photoresist layer. Such photoresist layers, which have a certain adhesive effect, are used variously in semiconductor technology to create patterns on semiconductor surfaces. In this application, the photoresist is used for the purpose of forming an adhesive layer which includes two different regions, namely a region which cannot be be cured by photographic techniques, since it is covered by the semiconductor chips, and another region, which is freely accessible and can be cured, for example, by UV rays.

For other photoresists, there is the possibility that they are not cured by UV irradiation but destroyed, so that they can subsequently be removed from the base film. However, such stripping of the UV-irradiated regions of the semiconductor layer from the base film has the disadvantage that, during the subsequent application of the plastic package molding compound, these stripped regions form a step in relation to the surfaces of the semiconductor chips, so that an ideal coplanar surface for the application of a wiring structure is not formed.

In accordance with another embodiment the invention, a carrier sheet as described above is used for the production of semiconductor devices. A method for producing semiconductor devices using the carrier sheet, the semiconductor devices respectively including a plastic package with a semiconductor chip, includes the following method steps. First, a semiconductor wafer, which has semiconductor chips arranged in rows and columns, is produced. The semiconductor chips include active upper sides and corresponding back sides, the active upper sides being provided with contact areas. These contact areas are accessible from the upper side of the semiconductor chips and are internally connected to the integrated circuits on the semiconductor chip. After producing such a semiconductor wafer with semiconductor chips arranged in rows and columns, the semiconductor wafer is separated into individual semiconductor chips.

Independently of the production of the semiconductor chips, a carrier sheet for a panel is produced, the upper side of the carrier including a double-sided adhesive film with a film underside and a film upper side. The film underside is adhesively fixed on the carrier sheet, and the upper side remains freely accessible, and includes semiconductor device positions arranged in rows and columns. Next, this carrier sheet with the double-sided adhesive film is loaded with the individual semiconductor chips from the freely accessible film upper side, the individual semiconductor chips being arranged with their active upper sides on the film upper side of the adhesive film in the respective semiconductor device positions. After loading, a deactivation of the freely accessible film upper side takes place, thereby reducing the adhesive effect of the freely accessible film upper side.

Subsequently, a plastic package molding compound is applied to the freely accessible plastic upper sides, thereby embedding the semiconductor chips in the plastic package molding compound, a panel with a coplanar upper side being produced from plastic package molding compound and upper sides of the semiconductor chips. After that, the carrier sheet with the double-sided adhesive plastic film can be removed from the coplanar surface of the panel. Finally, the panel is finished by completing the semiconductor devices by applying a wiring structure with external contact areas and with interconnects from the contact areas of the semiconductor chips to corresponding external contact areas on the coplanar upper side. The panel is then separated into individual semiconductor devices.

One advantage of the method of the invention is that, due to the deactivation of the freely accessible film upper side, a smooth, coplanar upper side is produced in the region of the plastic package molding compound. This upper side can be covered directly with a wiring structure, for example, comprising a copper coating, without the occurrence of planarity problems.

In another exemplary embodiment of the method of the invention, an adhesive layer is applied to a heat-resistant base film of polyethylene terephthalate (PET) or of ethylene-modified polytetrafluoroethylene (ETFE), both to the underside of the base film and to the upper side of the base film. An acrylic-containing adhesive is preferably used on both sides.

In a further example of the method of the invention, a heat-resistant base film is used as the double-sided adhesive film, with a thermoactive adhesive on the film underside toward the carrier sheet, and with a pressure-sensitive film on the film upper side for the fixing of semiconductor chips and for the irradiation or deactivation of the regions surrounding the semiconductor chips.

An adhesive photoresist can also be used as the adhesive layer on the upper side of the heat-resistant base film. The deactivation is preferably carried out from the freely accessible film surfaces, after applying the semiconductor chips, with the aid of UV rays. In a further example of the method of the invention, the freely accessible film surfaces are treated by plasma techniques that are conventional in semiconductor technology, after applying the semiconductor chips.

After the removal of the carrier sheet with the double-sided adhesive film according to the invention, a panel is obtained and can additionally be loaded with external contacts on the external contact areas of the wiring structure as soon as the wiring structure is applied. However, this loading may also take place after the panel has already been separated into individual semiconductor devices.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

BRIEF DESCRIPTION OF THE DRAWINGS

FIG. 1A schematically depicts a cross-section of a panel on a carrier sheet with adhesive film, according to an exemplary embodiment of the invention.

FIG. 1B schematically depicts a magnified view of a portion of the carrier sheet with adhesive film.

FIG. 2 schematicall depicts a cross-section through the carrier sheet of the panel of FIG. 1A, before the application of a plastic package molding compound and during the deactivation of the regions of the adhesive film surrounding the semiconductor chips.

FIG. 3 schematically depicts a cross-section through the carrier sheet of FIG. 2 after completion of the deactivation.

DETAILED DESCRIPTION

FIG. 1A shows a schematic cross-section of a panel 22 on a carrier sheet 6 with adhesive film 1, according to one embodiment of the invention. The panel 22 includes a number of semiconductor device positions 21, which are arranged in columns and rows, in this cross-section only dash-dotted lines

25 showing the series arrangement of the semiconductor device positions 21 with their plastic packages 14. A semiconductor device 13 is arranged in each of the semiconductor device positions 21 shown here, all the semiconductor devices 13 of the panel 22 being held by the common carrier sheet 6 in this state of prefabrication. This carrier sheet 6 is loaded with the adhesive film 1, which includes a base film 2, which is preferably produced from a thermally resistant PET material.

The underside 4 of the base film 2 includes a thermoactive adhesive layer 5, by which the double-sided adhesive film 1 is connected to the carrier upper side 18 of the carrier sheet 6. The upper side 18 of the carrier sheet 6 consequently forms at the same time the film underside 20 of the adhesive film 1. For the removal of the rigid carrier sheet 6, the thermoreactive adhesive layer 5 is heated, so that the carrier sheet 6 can be pulled off.

The adhesive film 1 is connected at least to the active upper sides 15 of the semiconductor chips 8, which include contact areas 17, in each of the semiconductor device positions 21. However, due to the deactivation of the adhesive effect of the adhesive layer 7 on the upper side 3 of the base film 2 in accordance with the invention, the effect is achieved that the applied plastic package molding compound 11 is no longer integrally connected to the film upper side 19 in the deactivated regions 9, so that the double-sided adhesive film 1 can be pulled off from the panel 22 without forming residues on the coplanar upper side 23 including semiconductor chip upper sides 15 and plastic package molding compound. After the pulling-off of the adhesive film 1, the active upper sides 15 of the semiconductor chips 8 are accessible, so that the contact areas 17 located there can be connected by wiring structures to be applied to corresponding external contact areas via corresponding interconnects. The pulling-off of the double-sided adhesive film 1 from the region of the plastic package molding compound 11 has the advantage that the application of a wiring structure is then readily possible on the coplanar upper side 23.

As can be seen in FIG. 1B, the boundary layer 26 between the applied plastic package molding compound 11 and the deactivated region 9 of the adhesive layer 7 is once again especially illustrated, the adhesive forces in the boundary surface 26 being reduced by the deactivation of the adhesive layer 7 in such a way that the adhesive layer 7 does not form any residues on the boundary layer 26 toward the plastic package molding compound 11. Instead of an adhesive layer 7, an adhesive film 12 may also be used.

FIG. 2 shows a schematic cross-section through the carrier sheet 6 for the panel 22 of FIG. 1A, before the application of a plastic package molding compound 11, as is shown in FIG. 1A, and during the deactivation of the regions 9 of the adhesive film 1 surrounding the semiconductor chips 8. For this purpose, the semiconductor chips 8 are applied with their upper active sides 15 to the adhesive film 1, while their back sides 16 are exposed to the UV radiation 24. In this embodiment, the entire film upper side 19 of the adhesive film 1 is worked with UV rays 24, the adhesive layer 7 in the actively adhesive regions 10 under the semiconductor chips 8 being protected from UV radiation, and the regions which surround the semiconductor chips 8 being exposed to an aging process by the UV radiation 24.

In this case, depending on the type of adhesive layer 7, either high degrees of crosslinking of the polymers form, so that the adhesive effect with respect to the plastic package molding compound is reduced, or, as in the case of photoresist layers, the regions which are irradiated with UV can be attacked in such a way that they can subsequently be removed by so-called "stripping". In such a case, the plastic package molding compound will come into contact with the heat-resistant base film, which however does not enter into interaction adhesively with the plastic package molding compound. However, when such an adhesive photoresist is used, a step forms in the coplanar upper side 23, in that a step is created in relation to the upper sides 15 of the semiconductor chips 8 and could possibly cause problems when a wiring structure is applied to the panel.

This depends on how sharp-edged the transitions are formed at the borders with the semiconductor chips 8. In the case of an acrylic-coated base film 2, however, the acrylic coating is retained, and the deactivation by UV rays 24 entails a higher degree of crosslinking, so that the acrylic-containing adhesive layer 7 ages in such a way that its adhesion in relation to the plastic package molding compound is correspondingly reduced. Once the UV radiation 24 has acted on the accessible regions 9 for a limited time, they are deactivated and a state such as that shown in FIG. 3 is obtained.

FIG. 3 shows a schematic cross-section through the carrier sheet 6 of FIG. 2, after completion of the deactivation. On the adhesive layer 7 on the upper side 3 of the base film 2 in the irradiated regions 9, a deactivation has occurred by increased crosslinking of the chain molecules in the adhesive layer 7, so that the adhesive effect is then reduced by the artificial aging of the adhesive layer 7. By contrast, the adhesive effect remains unchanged in the region of the adhesively attached semiconductor chips 8, so that here the semiconductor chips 8 can be kept in position by the carrier sheet 6 according to the invention while a plastic package molding compound is applied by dispensing or by injection molding.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

1 adhesive film
2 base film
3 upper side of the base film
4 underside of the base film
5 thermoactive adhesive layer (of the underside)
6 carrier sheet
7 adhesive layer (of the upper side)
8 semiconductor chip
9 deactivated region
10 actively adhesive region
11 plastic package molding compound
12 adhesive film
13 semiconductor device
14 plastic package
15 active upper side of the semiconductor chip
16 back side of the semiconductor chip
17 contact areas of the semiconductor chip
18 carrier upper side
19 film upper side
20 film underside
21 semiconductor device position
22 panel
23 coplanar upper side 24 UV radiation
25 dash-dotted line
26 boundary surface

What is claimed:

1. A method for producing semiconductor devices with a carrier sheet with adhesive film, wherein each of the semiconductor devices includes a plastic package with a semiconductor chip, the method comprising:

producing a semiconductor wafer including a plurality of semiconductor chips that are arranged in rows and columns and include active upper sides and back sides, wherein the active upper sides are provided with contact areas;

separating the semiconductor wafer into individual semiconductor chips;

producing a carrier sheet including a double-sided adhesive film applied to an upper side of the carrier sheet, wherein the adhesive film includes a thermoactive film underside and a film upper side, the film underside is adhesively fixed on the upper side of the carrier sheet, and the film upper side remains freely accessible and includes semiconductor device positions arranged in rows and columns;

loading the freely accessible film upper side with the individual semiconductor chips, wherein the individual semiconductor chips are arranged with the active upper sides of the semiconductor chips on the film upper side of the adhesive film in the semiconductor device positions;

forming deactivated portions of the film upper side that are not covered with semiconductor chips so as to reduce the adhesive effect of the deactivated portions;

applying a plastic package molding compound film upper side so as to embed the semiconductor chips in the plastic package molding compound and to form a panel with a coplanar surface that includes the plastic package molding compound and active upper sides of the semiconductor chips;

removing the carrier sheet from the thermoactive film underside of the double-sided adhesive film, and subsequently removing the double-sided adhesive film from the coplanar surface;

forming a panel by applying to the coplanar surface a wiring structure with external contact areas and with interconnects from contact areas of the semiconductor chips to the external contact areas; and separating the panel into individual semiconductor devices.

2. The method of claim 1, wherein the double-sided adhesive film comprises adhesive layers that are applied to a heat-resistant base film, and the base film comprises one of polyethylene terephthalate and an ethylene-modified polytetrafluoroethylene.

3. The method of claim 1, wherein the double-sided adhesive film comprises a heat-resistant base film with acrylic-containing adhesive applied on each opposing side of the base film.

4. The method of claim 1, wherein wherein the double-sided adhesive film comprises a heat-resistant base film, and the base film includes a thermoactive adhesive film on the film underside oriented toward the carrier sheet and a pressure-sensitive film on the film upper side oriented toward the semiconductor chips.

5. The method of claim 1, wherein the double-sided adhesive film comprising a heat-resistant base film including an adhesive photoresist applied as the adhesive layer to an upper side of the base film.

6. The method of claim 1, wherein the deactivated portions are formed by irradiating with UV rays the portions of the film upper side that are not covered by semiconductor chips.

7. The method of claim 1, wherein the deactivated portions are formed by treated the portions of the film upper side that are not covered by semiconductor chips with plasma, the plasma including at least one gas selected from the group consisting of argon, helium, hydrogen, oxygen, tetrafluoromethane and sulfur hexafluoride.

8. The method of claim 1, wherein the external contact areas are loaded with external contacts before separation of the panel.

* * * * *